(12) United States Patent
Belford

(10) Patent No.: US 6,514,836 B2
(45) Date of Patent: *Feb. 4, 2003

(54) METHODS OF PRODUCING STRAINED MICROELECTRONIC AND/OR OPTICAL INTEGRATED AND DISCRETE DEVICES

(76) Inventor: Rona Elizabeth Belford, 3 Stonegate Dr., Hilton Head Island, SC (US) 29926

( * ) Notice: Subject to any disclaimer, the term of this patent is extended or adjusted under 35 U.S.C. 154(b) by 0 days.

This patent is subject to a terminal disclaimer.

(21) Appl. No.: 09/873,047

(22) Filed: Jun. 4, 2001

(65) Prior Publication Data

US 2002/0182775 A1 Dec. 5, 2002

(51) Int. Cl.⁷ .......................... H01L 21/30; H01L 21/46
(52) U.S. Cl. ............................ 438/457; 438/50; 438/29; 438/938; 438/973
(58) Field of Search ...................... 438/29, 46, 50, 438/285, 457, 590, 938, 973

(56) References Cited

U.S. PATENT DOCUMENTS 6,362,076 B1 * 3/2002 Inazuki et al. .............. 438/458

OTHER PUBLICATIONS

US 6,391,219, 5/2002, Kang et al. (withdrawn)*
Dr. Rona E. Belford, "Mechanically Strained, High Mobility, Strained–Si Devices", Mar. 24, 1998, The Small Business Innovation Research Program Website (www.winbmdo.com), '98 SBIR Phase I . . . Topic 14—Electronic Materials.*

* cited by examiner

Primary Examiner—Stephen D. Meier
Assistant Examiner—Khanh B. Duong

(57) ABSTRACT

A new method of producing strained crystalline semiconductor microelectronic devices. Microelectronic devices can either be formed within a membrane, prior to straining or processed after straining. The method includes the steps of straining a membrane along at least one axis and straining using wafer-bonding techniques.

22 Claims, 4 Drawing Sheets

METHODS OF PRODUCING STRAINED MICROELECTRONIC AND/OR OPTICAL INTEGRATED AND DISCRETE DEVICES

This application claims the benefit of U.S. patent application Ser. No. 09/710,127 filed Nov. 29, 2000 by the same author, as prior knowledge.

BACKGROUND OF THE INVENTION

1. Technical Field

This invention generally relates to microelectronics, and more particularly, to a method of producing strained crystalline semiconductor-based microelectronic and/or optical integrated and discrete devices and materials.

2. Background of the Invention

Crystalline semiconductors have proven to be increasingly useful. Types of crystalline semiconductor-based microelectronic devices are given here to include integrated circuits and discrete devices of all types including; uni-polar transistors, bi-polar transistors, radiation emitting devices, photo-sensitive devices, lasers, photonic devices and the crystalline semiconductor material itself For purposes of explanation the following is written using silicon as an example. This invention is also valid for other semiconductor materials such as Si/Ge alloys, GaAs, Ge, SiC among others.

Integrated circuits, for example, are produced on Si wafers. It has been found that introducing strain into the integrated circuit has beneficial properties, e.g., increased conductance. This is increasingly important as the limits of the semiconductor material and current fabricating processes are reached.

At present all high performance tensile strained-silicon devices are strained bi-axially via expensive, highly technical heterostructure fabrication. Strain is introduced in a silicon layer by incorporating atoms of larger atomic volume into the silicon lattice, such as germanium (Ge), then epitaxially growing a strained-silicon layer on top. The deposited silicon layer is bi-axially strained as a result of lattice mismatch. The entire process is expensive as strain is induced prior to processing and subsequent device fabrication is entirely non-standard. This research is device-level research only.

With regard to integrated circuit fabrication, metal oxide semiconductor field effect transistors (MOSFETs) form the basis of complementary metal oxide semiconductor (CMOS) circuits, which are by far the most common integrated circuits. As integrated circuits such as microprocessors evolve, faster operating performance is required. It is preferable, for speed and power considerations, for the chip to be as small as possible. Decreasing dimensions is termed scaling. As CMOS dimensions decrease to deep submicron channel lengths, subtle short channel effects such as source/drain parasitic resistances and velocity saturation of carriers in the channel, become more significant. Many types of devices benefit from the introduction of strain within the semiconductor device, e.g., bipolar transistors. Radiation-hard technologies rely on ion-implantation to achieve both the required buried oxide and the radiation hardness treatments. This degrades the quality of the semiconductor.

The present invention is aimed at one or more oft he problems identified above.

SUMMARY OF THE INVENTION

In a first aspect of the present invention, a method of producing strained crystalline semiconductor microelectronic devices is provided. Microelectronic devices being formed within a membrane. The method includes the steps of straining a membrane along at least one axis and bonding the membrane to a base substrate.

In a second aspect of the present invention, a method for producing strained crystalline microelectronic devices is provided. The method includes the steps of producing microelectronic devices in the form of a membrane, straining the membrane along at least one axis, and bonding the membrane to a base substrate.

In a third aspect of the present invention, a method of producing strained crystalline microelectronic devices is provided. A plurality of crystalline microelectronic devices being integrally formed in a membrane. The method includes the steps of producing the membrane, straining the membrane along at least one axis via thermal bonding techniques to a base substrate.

In a fourth aspect of the present invention, a method of producing strained crystalline microelectronic devices is provided via standard Silicon-On-Insulator (SOI) methods and allows access to the Si-insulator interface prior to straining and bonding. Straining is effected here by thermal bonding techniques.

DETAILED DESCRIPTION OF THE PREFERRED EMBODIMENT

With reference to the drawings and in operation, the present invention provides a method of producing in-plane tensile-strained crystalline semiconductor microelectronic devices or semiconducting material. The method is suitable for any type of microelectronic device as afore mentioned; including integrated circuits and discrete devices of all types including; uni-polar transistors, bi-polar transistors, radiation emitting devices, photo-sensitive devices, lasers, photonic devices and the semiconductor material itself With reference to FIG. 1, any microelectronic device 102 fabricated using any means may be used. The microelectronic device 102 includes for example a silicon wafer or a Si die 104.

The process of the present invention introduces strain to the microelectronic device after fabrication, i.e., after the electronic circuits have been formed on the silicon wafer 104. However the technique can be used as a front-end process where the device is simply the material itself e.g. silicon. The applied stress strains and/or stretches the microelectronic device 102 along at least one axis, as described below.

For purposes of explanation only, some of the following discussion will be in terms of an individual die. However, the methods are equally applicable to the wafer of die scale.

Prior to the microelectronic device 102 being placed under strain, the silicon wafer 104 must have a predetermined thickness, i.e., atomic scale up to 100 microns depending on the application and the amount of strain desired.

Figure 1A:
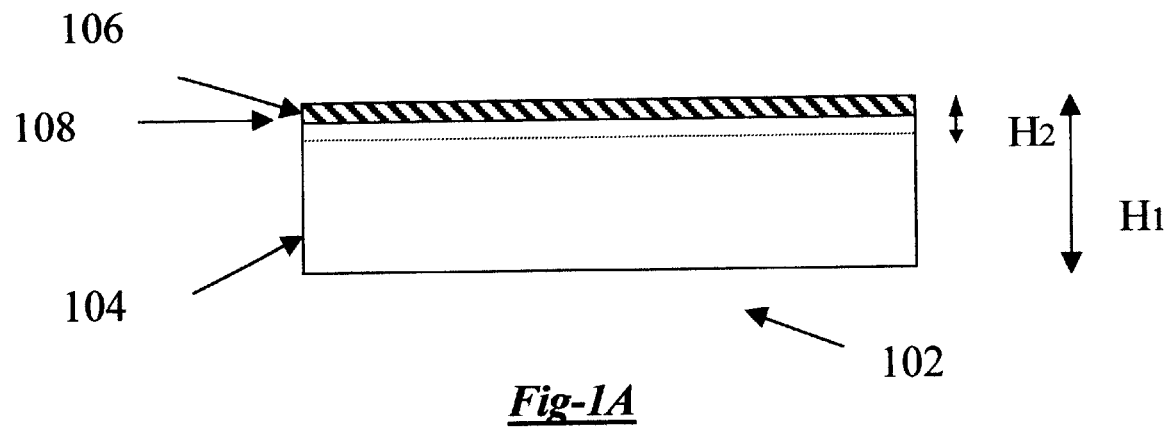
FIG. 1A is a side view of crystalline microelectronic devices.
Figure 1B:
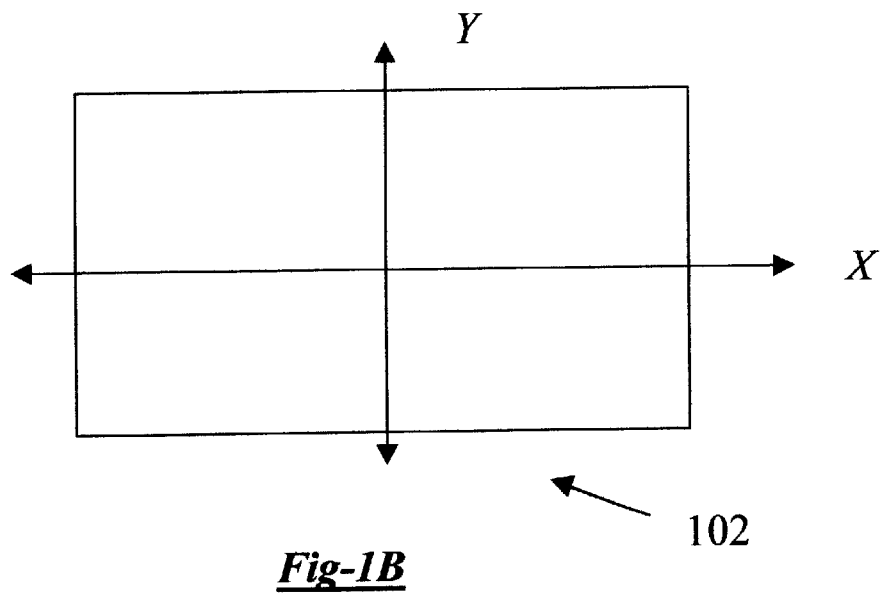
FIG. 1B is a top view of the microelectronic devices of FIG. 1A.

With reference to FIG. 1, preferably the silicon wafer 104 has an initial thickness of $H_1$, (generally about 650 microns for a six (6) inch wafer). The silicon wafer 104 must be reduced in thickness to reach a desired thickness of $H_2$, shown in dotted line. The reduced-in-thickness silicon 104 and the integrated device or devices 106 is referred to as a membrane 108. Reducing the thickness of the Si 104 may be accomplished by any suitable means or combination of such means, e.g., chemical-mechanical polishing (CMP), grinding, lapping, polishing, and/or etching.

Figure 2:
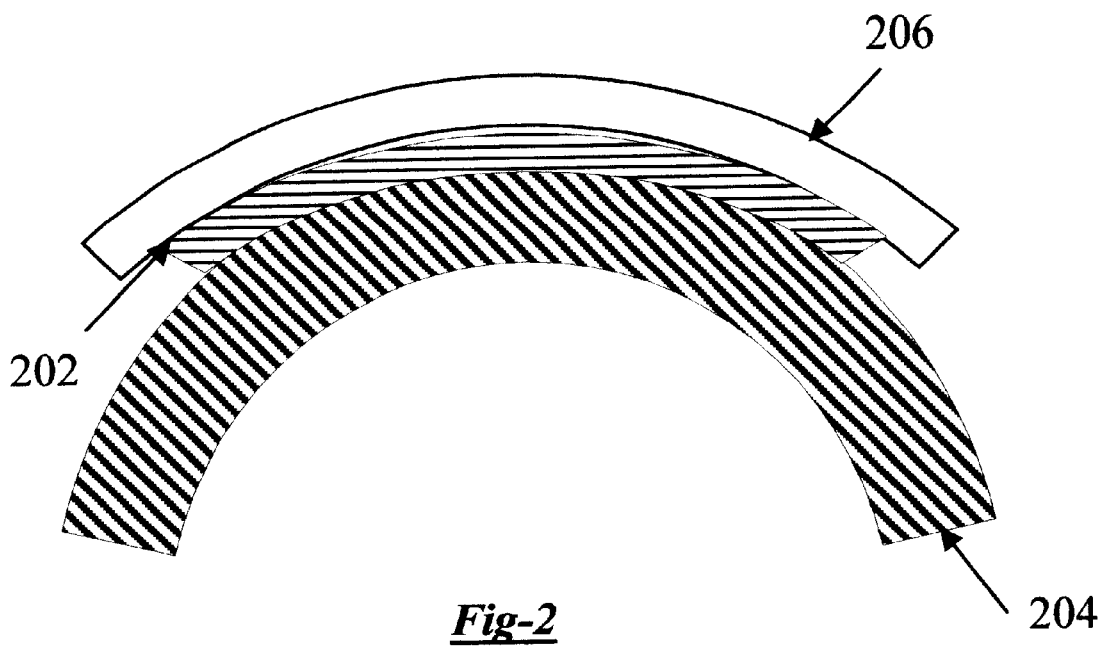
FIG. 2 is a diagrammatic illustration of stress and/or strain being mechanically applied to a membrane, according to an embodiment of the present invention.

The membrane 108 is then strained (in-plane) uni-axially along either a first axis X or a second axis Y or bi-axially along both the axes X and Y. With specific reference to FIG. 2, in an embodiment of the present invention a thin membrane 202 is first positioned, face down over the curvature of a support structure 204. Preferably, the support structure 204 is composed from any rigid material. The membrane 202 is bonded to another membrane (sheet) composed of either crystalline, poly crystalline or amorphous material 206. Preferably, the sheet 206 has a thickness of greater than 20 microns and the membrane 202 has a thickness of less than 10 microns. After the membrane 202 and the semiconductor sheet 206 have been bonded together, they are released from the curved support. The thicker sheet springs back into a planar shape and the thinner membrane is stretched in this process. The thicker membrane (sheet) is further bonded to a base substrate (not shown).

With regard to FIGS. 3–8, several methods for biaxial straining are illustrated.

Figure 3:
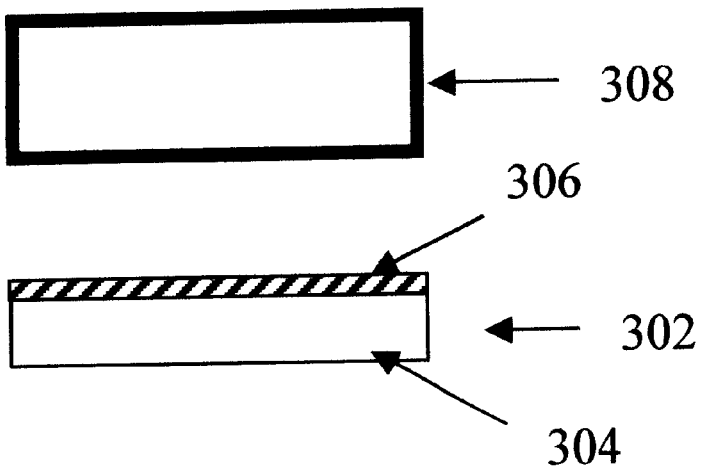
FIGS. 3–5, are diagrammatic illustrations of a membrane during a thermal process to apply stress and/or strain thereto, according to an embodiment of the present invention; and, FIGS. 6–8 are diagrammatic illustrations of a membrane being formed via standard SOI processes and these are used together with thermal processes to apply stress and/or strain thereto, according to an embodiment of the present invention.
Figure 4:
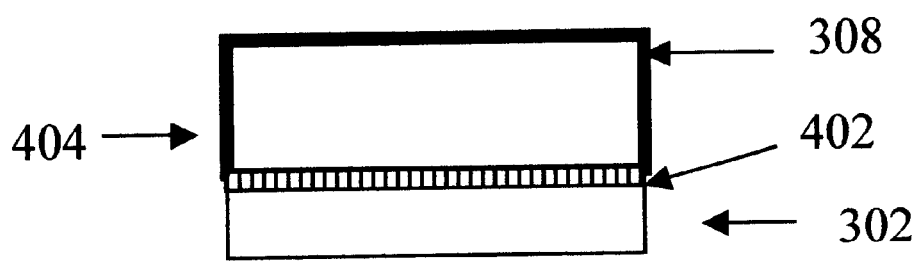
Figure 5:
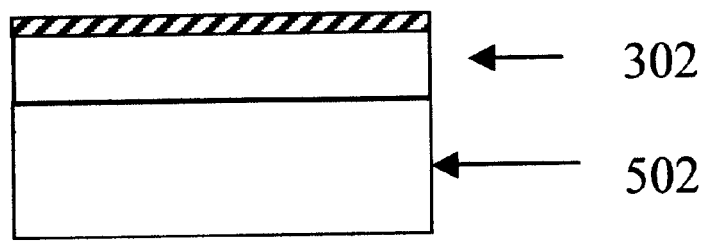

With specific reference to FIGS. 3–5, in one embodiment of the present invention a membrane 302 is strained bi-axially using differential thermal bonding. The membrane 302 is bonded to a temporary support 308 with a layer of temporary adhesive 402. The temporary support 308 is composed of a suitable material for example Si. With reference to FIG. 4, the bonded temporary support 308 and the membrane 302 form the combined structure 404. Structure 404 is held at a pre-defined temperature while being bonded to permanent substrate 502 that is held at a relatively lower temperature. The substrate 502 may be composed of the same material as the temporary substrate 308 or of a material of different thermal expansion coefficient. The temporary substrate is removed and once at thermal equilibrium the microelectronic device is under bi-axial tensile strain FIG. 5.

Figure 6:
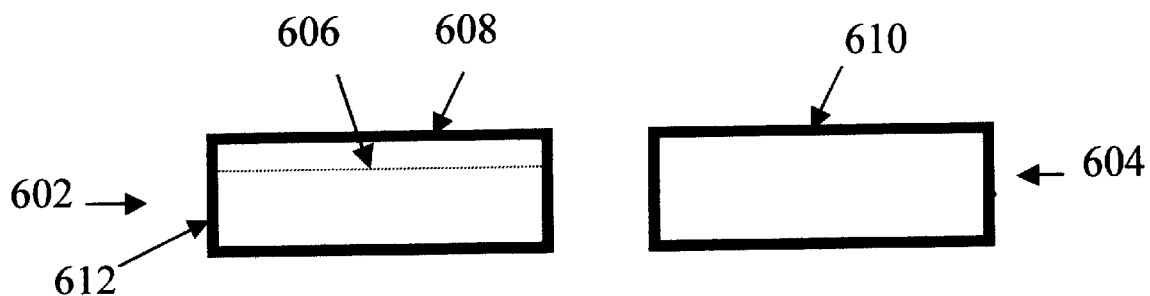
Figure 7:
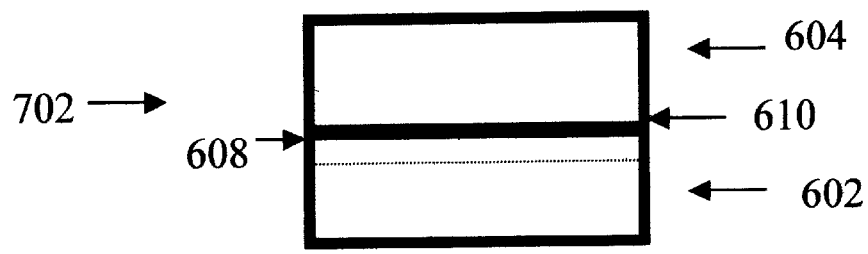
Figure 8:
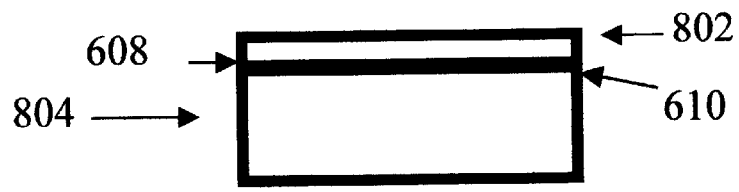

With reference to FIGS. 6–8, standard SOI techniques can be used along with Differential Thermal Bonding techniques to induce biaxial strain into semiconducting materials prior to processing. With specific reference to FIG. 6, a Si wafer (for example) 602 has hydrogen implanted to the required depth 606. The surface of either /or both wafers; 608 and 610 are oxidized and bonded together via differential thermal bonding as described above (FIGS. 3–5). The wafers need not be of the same material. The resulting structure 702 is formed (FIG. 7). The structure is further heated and the hydrogen reacts causing the bulk of the substrate 612 to crack off. FIG. 8 illustrates the resulting structure 804. The final surface used for processing is usually refined further by polishing. The SOI method employed is called "SMART CUT" combining this method with differential thermal bonding is a effective way of creating strained Si on insulator (SSOI). It also offers possibilities on special treatments on or through surface 608. For example, topical treatments or short distance diffusions could be used to give qualities of e.g. radiation hardness. In this way the final processing surface is of far better quality than if the standard radiation hard implantation or diffusion steps had been carried out through the processing surface. This method opens the route for many structures previously not possible.

Industrial Applicability

Different embodiments of this invention can be used as either semiconductor material processes (front end process) or as a back end process, after device fabrication. In either case the final devices will enjoy all the benefits of strained Si. These along with other industrial applicability and benefits are detailed in the sited prior knowledge U.S. patent application Ser. No. 09/710,127 filed Nov. 21, 2000.

Strain Considerations:

Prior to fixing, the degree of strain can be varied and controlled with high precision.

Material Considerations and the Sub-Micron Regime:

Enhancing the mobility and or conductivity of silicon has several advantages especially in submicron regime.

Superiority Over The Current State Of The Art:

The superiority of this invention over state of the art technology is identified in the sited prior knowledge U.S. patent application Ser. No. 09/710,127 filed Nov. 21, 2000.

Optical Benefits:

There is an opportunity to make optical devices within both uni- and bi-axially strained-Si, which are not otherwise possible. The possibility of multi membrane wafer bonding opens a route to 3-dimensional optical interconnects. If strained dies are mounted and bonded on to transparent supports access to devices could be made optically from remote sites and again opens the possibility of 3-D interconnection. Also at the membrane thickness we are using not only IR radiation but optical range possibilities exist. Straining single crystal material modifies the band gap giving new spectral regions for optical components fabricated within the strained semiconductor.

What is claimed is:

1. A method of producing a strained crystalline semiconductor microelectronic device, including the steps of:

bonding a first membrane to a second membrane while the first and second membranes are deformed by a cylindrical support, the microelectronic device being formed within the first membrane, the second membrane being thicker than the first membrane; and, releasing the first and second membrane from the cylindrical support.

2. A method producing a strained crystalline semiconductor microelectronic device, including the steps of:

reducing a thickness of a wafer to a predetermined thickness to form a membrane, the microelectronic device already being formed within the membrane;

applying a tensile strain to the membrane along at least one axis, and bonding the membrane to a base substrate.

3. A method, as set forth in claim 2, wherein the predetermined thickness is less than or equal to 100 microns.

4. A method, as set forth in claim 2, wherein the step of reducing the thickness of the membrane is performed by one or a combination of chemical-mechanical polishing, grinding, lapping, polishing and etching.

5. A method of a producing strained crystalline semiconductor microelectronic device, including the steps of:

bonding a membrane to a temporary support, the microelectronic device being formed within the membrane;

elevating a temperature of the membrane and the temporary support; and, bonding the membrane and temporary support structure to a substrate, the substrate being at a lower temperature than the membrane and temporary support during the bonding process.

6. A method, as set forth in claim 5, including the steps of:

removing the temporary support; and, allowing the membrane and substrate to reach an equilibrium temperature.

7. A method, as set forth in claim 5, wherein the temporary support and the substrate are composed of the same material.

8. A method, as set forth in claim 5, wherein the temporary support and the substrate are composed of different material.

9. A method of producing a strained semiconductor wafer, including the steps of:

bonding a first wafer to a second wafer, the first wafer being at a first temperature, and the second wafer being at a second temperature, the first temperature being higher than the second temperature; and, removing a bottom portion of the first wafer from a top portion of the first wafer, leaving the top portion bonded to the second wafer.

10. A method, as set forth in claim 9, wherein the step of removing a bottom portion of the first wafer from the top portion of the first wafer includes the steps of:

implanting atoms in the first wafer prior to the step of bonding the first wafer to the second wafer; and, heating the bonded first and second wafers.

11. A method, as set forth in claim 10, wherein the atoms are implanted to a predetermined depth.

12. A method, as set forth in claim 10, wherein the atoms are hydrogen atoms.

13. A method, as set forth in claim 9, including the step of oxidizing a top surface of at least one of the first and second wafers prior to bonding, wherein the first and second wafers are bonded at the top surfaces.

14. A method, as set forth in claim 9, including the step of performing Radiation-Harding treatments on at least one of the first and second wafers prior to bonding.

15. A method, as set forth in claim 9, including the step of performing chemical treatments on at least one of the first and second wafers prior to bonding.

16. A method, as set forth in claim 9, including the step of forming the microelectronic device in the top portion.

17. A method, as set forth in claim 16, including the step of polishing a top surface of the top portion and second wafer prior to the step of forming microelectronic devices in the top portion.

18. A method, as set forth in claim 9, including the step of allowing the bonded first and second wafers to reach an equilibrium temperature.

19. A method of producing a strained crystalline semiconductor microelectronic device, including the steps of:

bonding a first wafer to a second wafer, the first wafer being at a first temperature and the second wafer being at a second temperature, the first temperature being higher than the second temperature;

removing a bottom portion of the first wafer from a top portion of the first wafer, leaving the top portion bonded to the second wafer;

allowing the bonded first and second wafers to reach an equilibrium temperature; and, forming the microelectronic device in the top portion.

20. A method, as set forth in claim 19, including the step of oxidizing a top surface of the first and second wafers prior to bonding, wherein first and second wafers are bonded at the top surfaces.

21. A method, as set forth in claim 20, including the step of polishing a top surface of the top portion and second wafer prior to the step of forming microelectronic devices in the top portion.

22. A method, as set forth in claim 19, wherein the step of removing a bottom portion of the first wafer from the top portion of the first wafer includes the steps of:

implanting atoms in the first wafer before bonding; and, heating the bonded first and second wafers.

* * * * *